United States Patent [19]

Neilson

[11] 4,214,255

[45] Jul. 22, 1980

[54] GATE TURN-OFF TRIAC WITH DUAL LOW CONDUCTIVITY REGIONS CONTACTING CENTRAL GATE REGION

[75] Inventor: John M. S. Neilson, Mountaintop, Pa.

[73] Assignee: RCA Corporation, New York, N.Y.

[21] Appl. No.: 849,398

[22] Filed: Nov. 7, 1977

[30] Foreign Application Priority Data

Feb. 7, 1977 [GB] United Kingdom ............... 04944/77

[51] Int. Cl.² ......................................... H01L 29/747
[52] U.S. Cl. ........................................ 357/39; 357/56; 357/86; 357/90
[58] Field of Search ...................... 357/38, 39, 56, 90, 357/86

[56] References Cited

U.S. PATENT DOCUMENTS

| 3,437,889 | 4/1969 | Eubster ............................. 357/39 |
|---|---|---|
| 3,443,171 | 5/1969 | Knott et al. ....................... 357/39 |
| 3,476,993 | 11/1969 | Aldrich et al. .................... 357/39 |
| 3,538,401 | 11/1970 | Chu .................................... 357/90 |
| 3,914,780 | 10/1975 | Marek ................................ 357/39 |
| 3,996,601 | 12/1976 | Hutson .............................. 357/39 |
| 4,063,277 | 12/1977 | Gooen ............................... 357/39 |
| 4,110,781 | 8/1978 | Konishi et al. .................... 357/39 |
| 4,127,863 | 11/1978 | Kurata ............................... 357/38 |

FOREIGN PATENT DOCUMENTS 2425364  1/1975  Fed. Rep. of Germany ............. 357/38

OTHER PUBLICATIONS

G.E. SCR Manual, Fifth Edition, 1972, G.E., Syracuse, N.Y., 13201, p. 4.

*Primary Examiner*—Joseph E. Clawson, Jr.
*Attorney, Agent, or Firm*—Birgit E. Morris; Donald S. Cohen; Robert Ochis

[57] ABSTRACT

A semiconductor triac comprises means for switching the device from a conducting state to a blocking state. The means can be characterized as being a gate region which is substantially aligned with each of two anode regions. Each of the anode regions is adjacent a different one of two major opposing surfaces and are substantially misaligned with respect to each other.

17 Claims, 2 Drawing Figures

GATE TURN-OFF TRIAC WITH DUAL LOW CONDUCTIVITY REGIONS CONTACTING CENTRAL GATE REGION

The present invention generally relates to semiconductor devices and, in particular, relates to a regenerative semiconductor device which is gate controlled.

Gate controlled semiconductor regenerative devices can usually be categorized as either triacs or silicon controlled rectifiers (SCR)s. A triac, as known in the art, is designed to conduct current in a low impedance state with either polarity applied to the main terminals thereof and can be triggered by either a positive or negative voltage potential applied to the gate thereof. The usual method of turning off, i.e., switching the triac from the conducting state to a non-conducting, or high impedance state, is by interrupting the voltage applied to the main terminals for a time long enough to stop regeneration.

An SCR on the other hand, can generally be characterized as a device having a low impedance conducting state and a high impedance blocking state for a given polarity across the main terminals thereof. Such a device can be switched from the high impedance state to the low impedance state usually, for an NPNP device, by a positive gate potential applied to the gate region. Some SCRs can also be switched from the conducting state to the blocking state by, for an NPNP device, a negative gate potential. Devices having this capability are generally known as gate-turn-off devices (GTO's). If, however, the polarity across the two main terminals of an SCR is reversed the device remains in a high impedance state and if the reverse voltage becomes excessive it tends to become unstable and generally breaks down in the avalanche mode often damaging or destroying the device.

A device embodying the principles of the present invention incorporates the most advantageous features of the two above-described devices in that it can be switched from a high impedance state to a low impedance state with a positive gate voltage regardless of the relative polarity of the two main terminals. In addition, rather than requiring external circuitry to interrupt the voltage across the two main terminals, such a device can be switched from the low impedance conducting state to a high impedance blocking state by means of a negative potential applied to the gate. Such a device can be called a gate-turn-off triac.

Figure 1:
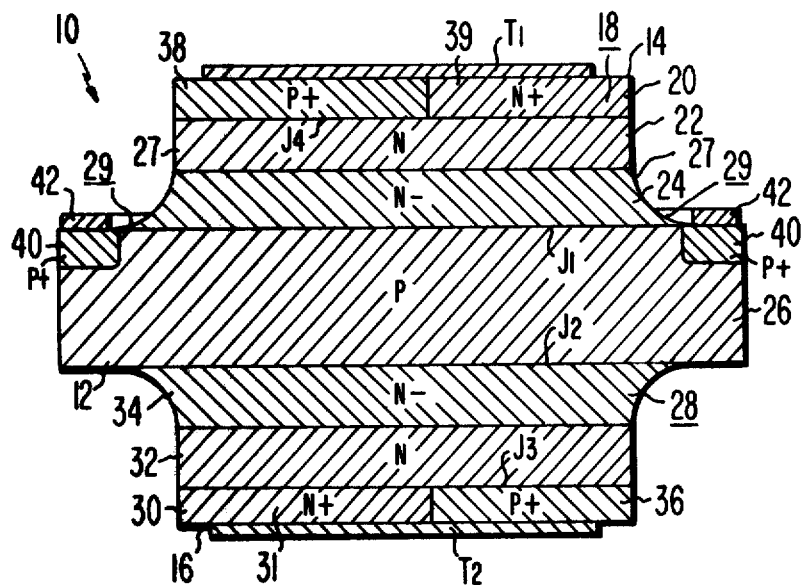
FIG. 1 is a cross-sectional view of a device, not drawn to scale, embodying the principles of the present invention.

A device, indicated generally at 10 in the drawing, embodying the principles of the present invention, comprises a body 12 of semiconductor material having first and second major opposing surfaces 14 and 16, respectively. In accordance with conventional usage, the use herein of positive (+) or negative (−) signs after a particular conductivity type designation indicates a region having either a higher or a lower conductivity, respectively, than a similar region without such a symbol. For example, an N+ region would have a comparatively higher conductivity, i.e., lower resistivity, than an N type region. It should also be noted that any region hereinafter described as having a particular type conductivity, i.e., N+ type, can alternatively be a P+ type region so long as all other conductivity types are likewise changed.

A first region 18 having a one or first type conductivity, N+ type, for example, is within the body 12 and adjacent the first surface 14. The conductivity concentration of the first region 18 preferably decreases with distance into the body 12 away from the first surface 14. Although the conductivity concentration can change gradually it is preferred that the first region 18 comprise first, second and third portions, 20, 22 and 24, respectively, having N+, N and N− type conductivities, respectively, arranged such that the overall conductivity concentration of the region 18 decreases in a step-like fashion away from the first surface 14. That is, in this case, the first portion 20 (N+ type) is adjacent the first surface 14, the second portion 22 (N type) is spaced apart from the first surface 14 by the first portion 20 and the third portion 24 is spaced apart from the first portion 20 by the second portion 22. Further, for reasons discussed, it is preferred that the first region 18 or at least the second and third portions, 22 and 24 respectively thereof, extend substantially completely across the device 10.

A gate region 26 having another or second type conductivity, in this example P type, is within the body 12 and adjacent the first region 18 forming a first PN junction $J_1$ at the interface therebetween. In the preferred embodiment, the gate region 26 is, in fact, adjacent the third portion 24 of the first region 18. Preferably, although a planar junction can also be utilized in this embodiment, the first PN junction, $J_1$ is a mesa junction. A mesa junction is generally characterized as one which terminates at a sidewall 27 of a moat 29. In conventional practice, such moats define or surround the individual pellets of a wafer. In this example, the first PN junction $J_1$ extends substantially completely across the lateral expanse of the body 12.

A second region 28 having the one type conductivity is within the body 12 and adjacent the gate region 26 forming a second PN junction $J_2$ at the interface therewith. The second region 28 is spaced apart from the first region 18 by the gate region 26. The second region 28 extends to the second major surface 16 and preferably has first, second, and third portions, 30, 32 and 34, respectively, having N+, N and N−-type conductivities, respectively, similar to the three portioned structure as the first region 18. In this instance, the first portion 30 (N+ type) is adjacent the second surface 16. Such a symmetrical configuration has obvious advantages for fabrication purposes.

A first anode region 36 having the second type conductivity is adjacent the second major surface 16 and extends into the second region 28 about the same distance as the first portion 30 thereof. The first anode region 36 forms a third PN junction $J_3$ with the second region 28 at the interface therebetween. Preferably, the first anode region 36 extends over about one-half of the area of the second surface 16. The N+ portion 30 of the second region 28 adjacent the second surface 16 is hereinafter, for reasons which will become obvious, designated as a second cathode region 31 and extends substantially completely across the portion of the second surface 16 not covered by the first anode region 36. As a result the first anode region 36 and the second cathode region 31 substantially comprise the second surface 16. Further, the first anode region 36 must be spaced apart from the gate region 26 by material of the second region 28. In addition the first anode region 36 must be substantially completely electrically isolated from the gate region 26.

A second anode region 38 having the other type conductivity, P+ type in this example, is adjacent the first surface 14 and extends into the first region 18, preferably co-extensively with the N+ first portion 20 thereof. The second anode region 38 forms a fourth PN junction $J_4$ at its interface with the first region 18. Preferably, the second anode region 38 is substantially completely aligned with the second cathode region 31 and must be spaced apart from the gate region 26 by material of the first region 18. In addition the second anode region 38 must be substantially completely electrically isolated from the gate region 26. For reasons known in the art, the second anode region 38 is preferably substantially misaligned with the first anode region 36. The N+ first portion 20 adjacent the first surface 14 is hereinafter designated as the first cathode region 39. As a result the second anode region 38 and the first cathode region 39 substantially comprise the first surface 14.

The cathode regions, which have the first type conductivity, may be referred to as first-emitter regions because they emit carriers of the first conductivity type. The anode regions, which have the second conductivity type, may be referred to as second-type emitter regions because they emit carriers of the second conductivity type.

A gate triggering region 40 is within the gate region 26 and has the same type conductivity as the gate region 26. Preferably, the gate triggering region 40 has a comparatively higher conductivity than the gate region 26. In this example, i.e., a mesa structure, the gate triggering region 40 is positioned at the bottom of the moat 29 and substantially completely surrounds the device 10.

Figure 2:
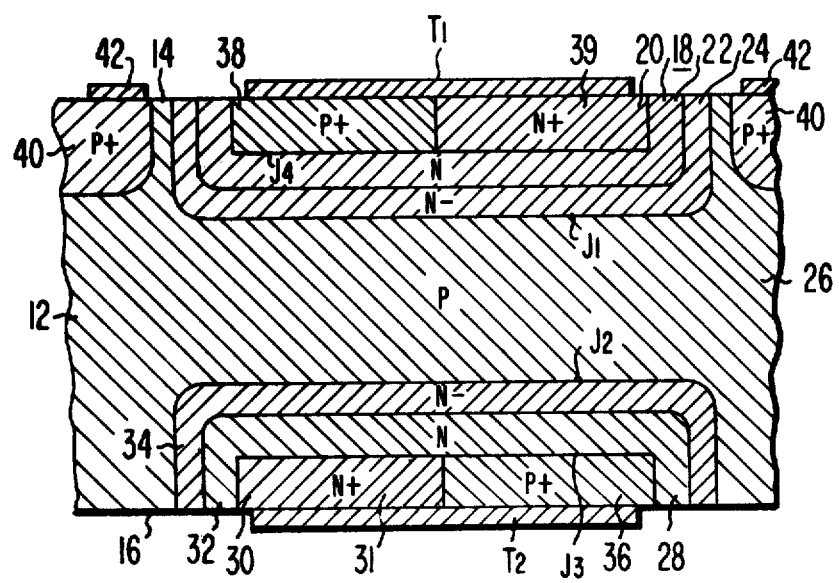
FIG. 2 is a cross-sectional view of another device, not drawn to scale, embodying the principles of the present invention.

The device 10 further comprises a first electrode $T_1$ which overlies the first surface 14 and electrically contacts the first cathode region 39 and the second anode region 38 extending thereto. A second electrode $T_2$ overlies the second surface 26 and electrically contacts the second cathode region 31 and the first anode region 36 extending thereto. A gate electrode 42 overlies and electrically contacts the P+ gate triggering region 40. While the principles of the present invention have been thus far discussed with respect to a mesa device 10 the principles are equally applicable for use in a planar device 50. The reference numerals used in FIG. 1 are used, for clarity, in FIG. 2 to indicate similar features in the device 50.

Each of the four modes of operation of the device 10 are hereinafter examined to clearly demonstrate the unique electrical characteristics thereof.

In the first mode, the first electrode $T_1$ is considered to be at ground potential and the second electrode $T_2$ is considered as being positive with respect to ground. Under the above biasing conditions, the first and third PN junctions $J_1$ and $J_3$ respectively, are forward biased and the second PN junction $J_2$ is reverse biased.

Upon the application of a positive gate voltage to the gate electrode 42 holes, effectively positive charges, are injected into the gate region 26 where they accumulate to overcome the forward bias conduction voltage of the first PN junction $J_1$. Such a voltage is usually on the order of about 0.7 volts. When the first PN junction $J_1$ conducts, electrons flow from the first cathode region 39 into the gate region 26 whereupon they drift across the reverse biased second PN junction, $J_2$. These electrons accumulate in the N type material adjacent the third PN junction $J_3$ and build up a voltage potential which becomes large enough to overcome the forward conduction voltage of that third PN junction $J_3$. When that happens, holes are injected from the first anode region 36 and flow toward the first cathode region 39. When the first anode region 36 supplies sufficient holes to insure the continued flow of electrons across the first PN junction $J_1$, the positive gate voltage is no longer necessary to sustain conduction thereacross and can be removed. This phenomenon is known as regeneration. The mechanism described above represents one method of switching the device 10 from a high impedance blocking state to a low impedance conducting state.

In the second mode of operation the first electrode $T_1$ is again considered to be at ground potential and the second electrode $T_2$ is again positive with respect thereto. Under these conditions, the junctions $J_1$, $J_2$ and $J_3$, are biased the same as before. However, in this mode a negative voltage is applied to the gate electrode 42. With a negative bias impressed thereon the gate region 26 becomes negative with respect to the first cathode region 39 and $J_1$ becomes reverse biased. Under such conditions, if the device 10 is initially in a high impedance blocking state, regeneration is substantially impossible and the device 10 remains in the blocking state. This is because the holes removed from the gate region 26 further reverse bias the second PN junction $J_2$ and the first PN junction $J_1$ does not become conductive. If, however, such a negative gate potential is applied when the device 10 is in a low impedance conducting state, the electrons injected into the gate region 26 recombine with the holes injected from the first anode region 36 as they pass through the gate region 26 and thereby reduce, and eventually turn off, the conducting plasma. This mechanism demonstrates that the device 10 has a gate-turn-off capability.

The third and fourth modes are operationally similar to the first and second modes. However, in each of these modes the first electrode $T_1$ is now considered to be positive with respect to the second electrode $T_2$ which is now considered to be at ground potential. Thus, under these conditions $J_2$ and $J_4$ are forward biased and $J_3$ is reverse biased. In the third mode, if a positive voltage is applied to the gate region 26 via the gate electrode 42, the second cathode region 31 initiates conduction across the device 10 to cause regeneration thereacross from the second cathode region 31. This is similar to the operation of the first anode region 36 and first cathode region 39 during the first mode. The third mode operation demonstrates that the device 10 can be switched into a low impedance conducting state for either polarity applied across the first and second electrodes $T_1$ and $T_2$.

In the fourth mode, however, a negative potential is applied to the gate electrode 42 and the PN junction $J_1$ becomes more reverse biased to prevent switching from a high impedance blocking state to a low impedance conducting state. However, as in the second mode, if the device 10 is initially in a low impedance conducting state upon the application of a negative voltage to the gate electrode 42 the device 10 is switched from the conducting state to the blocking state.

The device 10 as described has a number of significant features. For example, the device 10 can conduct current in a low impedance state for either polarity applied between the first and second electrodes, $T_1$ and $T_2$, respectively. Further, because the gate electrode 42 is not central to one of the surfaces 14 or 16, the first and second electrodes, $T_1$ and $T_2$, respectively, can be substantially identical. In addition the device 10 can be either turned on or turned off by a voltage applied to the gate electrode means 42. All of these features permit a device embodying the principles of the present invention to be used in place of most conventional triacs with a considerable savings due to not only ease of fabrication but also due to eliminating conventional turn off circuitry in favor of more simple triggering circuitry.

What is claimed is:

1. A gate turn-off semiconductor triac device having first and second main terminals and a gate electrode and capable (1) when it is in its high impedance state of blocking voltages applied across its main terminals in either polarity and (2) of being placed in a low impedance state for conducting current in a direction determined by the polarity of the voltage applied across its main terminals, said gate turn-off semiconductor triac device comprising:
   a body of semiconductor material having first and second major sides;
   a first region having a first conductivity type;
   a gate region having a second conductivity type disposed adjacent said first region, said gate region forming a first PN junction with said first region at its interface therewith, said gate region having a higher conductivity than the adjacent portion of said first region;
   a second region having said first conductivity type disposed adjacent said gate region and forming a second PN junction with said gate region at its interface therewith, the portion of said second region adjacent said gate region having a lower conductivity than said gate region, said second region being spaced apart from said first region by said gate region;
   a first first-type emitter region having said first conductivity type disposed adjacent said first region and said first major side of said body of semiconductor material, said first first-type emitter region being spaced from said gate region by said first region;
   a second first-type emitter region having said first conductivity type disposed adjacent said second region and said second major surface of said body of semiconductor material, said second first-type emitter region being spaced from said gate region by said second region;
   a first second-type emitter region having said second conductivity type disposed adjacent said second region and said second major side of said body of semiconductor material, said first second-type emitter region forming a third PN junction with said second region at its interface therewith, said first second-type emitter region being spaced apart from said gate region by said second region;
   a second second-type emitter region having second conductivity type disposed adjacent said first region and said first major side of said body of semiconductor material, said second second-type emitter region forming a fourth PN junction with said first region at its interface therewith, said second second-type emitter region being spaced apart from said gate region by said first region;
   first main terminal means disposed adjacent said first major side of said body of semiconductor material and contacting said first first-type emitter region and said second second-type emitter region;
   second main terminal means disposed adjacent said second major side of said body of semiconductor material and contacting said second first-type emitter region and said first second-type emitter region;
   gate electrode means contacting said gate region;
   said first second-type emitter region isolated from said gate region by said second and third PN junctions which together constitute a pair of back-to-back PN junctions;
   said second second-type emitter region isolated from said gate region by said first and fourth PN junctions which together constitute a pair of back-to-back PN junctions;
   whereby a gate signal of a predetermined polarity can switch said triac from its low impedance state to its high impedance state.

2. A semiconductor triac device as claimed in claim 9 further comprising:
   a gate triggering region having said second type conductivity extending into said gate region, said gate triggering region having a comparatively higher conductivity than said gate region.

3. A semiconductor triac device as claimed in claim 2 wherein:
   said first PN junction terminates at a sidewall of a moat extending into said body from said first surface, said moat substantially completely surrounding said device; and
   said gate triggering region is located at the bottom of said moat.

4. The gate turn-off semiconductor triac device recited in claim 1 wherein:
   said first conductivity type is N type;
   said second conductivity type is P type;
   said first first-type emitter region constitutes a first cathode region;
   said first second-type emitter region constitutes a first anode region;
   said second first-type emitter region constitutes a second cathode region; and
   said second second-type emitter region constitutes a second anode region.

5. A semiconductor triac device as claimed in claim 4 wherein:
   said first anode region and said second anode region are substantially misaligned.

6. The gate turn-off semiconductor triac device recited in claim 1 wherein:
   said first conductivity type is P type;
   said second conductivity type is N type;
   said first first-type emitter region constitutes a first anode region;
   said first second-type emitter region constitutes a first cathode region;
   said second first-type emitter region constitutes a second anode region; and
   said second second-type emitter region constitutes a second cathode region.

7. The gate turn-off semiconductor triac device recited in claim 6 wherein:
   said first anode region and said second anode region are substantially misaligned.

8. The gate turn-off semiconductor triac device recited in claim 1 wherein:
   said first region comprises first and second layer-like portions, said first layer-like portion having a comparatively lower conductivity than said first first-type emitter region and said second layer-like portion having a comparatively lower conductivity than said first portion, said second layer-like portion being adjacent to said gate region and being spaced apart from said first first-type emitter region and said second second-type emitter region by said first layer-like portion.

9. The gate turn-off semiconductor triac device recited in claim 1 wherein:
said second region comprises first and second layer-like portions, said first layer-like portion having a comparatively lower conductivity than said second first-type emitter region and said second layer-like portion having a comparatively lower conductivity than said first layer-like portion, said second layer-like portion being adjacent said gate region and being spaced apart from said second first-type emitter region by said first layer-like portion.

10. The gate turn-off semiconductor triac device recited in claim 1 wherein said gate region extends to both major sides of said device.

11. The gate turn-off semiconductor triac device recited in claim 10 wherein each of said major sides of said body of semiconductor material constitutes a substantially planar surface.

12. The gate turn-off semiconductor triac device recited in claim 1 wherein:
said first main terminal means makes ohmic contact to both said first first-type emitter region and said second second-type emitter region; and
said second main terminal means makes ohmic contact to said second first-type emitter region and said first second-type emitter region.

13. The gate turn-off semiconductor triac device recited in claim 1 wherein:
said gate contact is isolated from each of said first-type emitter regions by at least a back-to-back set of PN junctions; and
said gate contact is isolated from each of said second-type emitter regions by at least a PN junction.

14. The gate turn-off semiconductor triac device recited in claim 1 wherein:
said first region comprises a layer-like structure having a first layer and a second layer, said second layer being adjacent said gate region and having an interface therewith, said first layer spaced from said gate region by said second layer and having an interface with said first first-type emitter region and said second second-type emitter region, said second layer having a lower conductivity than said first layer;
said second region comprises a layer-like structure having a first layer and a second layer, said second layer of said second region being adjacent said gate region and having an interface therewith, said first layer of said second region being spaced from said gate region by said second layer and having an interface with said second first-type emitter region and said first second-type emitter region, said second layer of said second region having a lower conductivity than said first layer of said second region.

15. The gate turn-off semiconductor triac device recited in claim 14 wherein:
said first layer of said first region and said first layer of said second region have substantially the same conductivity; and
said second layer of said first region and said second layer of said second region having substantially the same conductivity.

16. The gate turn-off semiconductor triac device recited in claim 1 wherein:
said first first-type emitter region has a higher conductivity than said first region; and
said second first-type emitter region has a higher conductivity than said second region.

17. The gate turn-off semiconductor triac device recited in claim 1 wherein:
said first second-type emitter region has a higher conductivity than said gate region; and
said second second-type emitter region has a higher conductivity than said gate region.

* * * * *